(12) United States Patent
Tsironis

(10) Patent No.: US 9,276,551 B1
(45) Date of Patent: Mar. 1, 2016

(54) IMPEDANCE TUNERS WITH ROTATING MULTI-SECTION PROBES

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 41 days.

(21) Appl. No.: 14/315,566

(22) Filed: Jun. 26, 2014

Related U.S. Application Data

(60) Provisional application No. 61/842,606, filed on Jul. 3, 2013.

(51) Int. Cl.
*H03H 7/38* (2006.01)
*H03H 7/40* (2006.01)

(52) U.S. Cl.
CPC .. *H03H 7/40* (2013.01); *H03H 7/38* (2013.01)

(58) Field of Classification Search
CPC .................................. H03H 7/38; H03H 7/40
USPC .................................... 333/32, 33, 17.3, 263
See application file for complete search history.

(56) References Cited

U.S. PATENT DOCUMENTS

| | | | |
|---|---|---|---|
| 3,340,485 A * | 9/1967 | Caron ........................ | H01P 7/04 333/224 |
| 8,410,862 B1 | 4/2013 | Tsironis | |
| 2013/0002367 A1* | 1/2013 | Tsironis ................... | H03H 7/20 333/17.3 |

* cited by examiner

*Primary Examiner* — Stephen E Jones

(57) ABSTRACT

A new slide-screw impedance tuner structure uses multi-segment, disc-shaped, rotating metallic probes. This ensures probes covering multiple frequency bands to be served using a single vertical control mechanism, instead of multiple axes, motors, motor control and double or triple carriages. Additional benefits are high resolution in the area where the gap between center conductor and probe is small (high GAMMA), smooth increase of proximity between probe and center conductor (basic anti-corona discharge form) and the possibility to compensate for the negative phase slope at higher GAMMA, native to traditional slide screw tuners.

12 Claims, 20 Drawing Sheets

FIGURE 7: a) prior art, b) new

IMPEDANCE TUNERS WITH ROTATING MULTI-SECTION PROBES

PRIORITY CLAIM

This application claims priority on provisional application 61/842,606, filed on Jul. 3, 2013 titled: Impedance tuners with rotating multi-section probes.

CROSS-REFERENCE TO RELATED ARTICLES

1. Load pull measurements, http://en.wikipedia.org/wiki/Load_pull
2. Product Note 41, Computer Controlled Microwave Tuner—CCMT, Focus Microwaves January 1998.
3. Standing wave ratio, VSWR https://en.wikipedia.org/wiki/Standing_wave_ratio
4. Tapered impedance transformers http://www.microwaves101.com/encyclopedia/transformers_tapered.cfm
5. Application Note 15, High Resolution Tuners Eliminate Load Pull Performance Errors, Focus Microwaves, January 1995.
6. U.S. Pat. No. 8,410,862, "Compact Multi frequency range impedance tuner"

BACKGROUND OF THE INVENTION

This invention relates to RF load and source pull testing of medium and high power RF transistors and amplifiers using remotely controlled electro-mechanical impedance tuners. Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models only.

A popular method for testing and characterizing such microwave components (transistors) in the non-linear region of operation is "load pull". Load pull is a measurement technique employing microwave tuners and other microwave test equipment. The microwave tuners are used in order to manipulate the microwave impedance conditions under which the Device Under Test (DUT, or transistor) is tested (see ref. 1); this document refers hence to "impedance tuners", in order to make a clear distinction to "tuned receivers (radios)", popularly called elsewhere also "tuners" because of the included tuning circuits (see ref 2).

Impedance tuners in particular "slide screw tuners" consist, in general, of a transmission line and a number of adjustable parallel tuning elements (22, 30), FIGS. 2 to 5, which, when approaching the center conductor (32) of the airline (31) and moved along the axis of the airline (45) create a variable reactance, allowing thus the synthesis of various impedances (or reflection factors) covering parts or the totality of the Smith chart (the normalized reflection factor area). The relation between reflection factor and impedance is given by GAMMA=|GAMMA|*exp(jΦ)=(Z−Zo)/(Z+Zo), wherein Z is the complex impedance Z=R+jX and Zo is the characteristic impedance. A typical value used for Zo is Zo=50 Ohm (see ref. 3). The equivalent is the Voltage Standing Wave Ratio: VSWR=(1+|GAMMA|)/(1−|GAMMA|).

Up to now such tuning elements are made as metallic probes (slugs) and have had a cubical form (30, 41) with a concave bottom (35) which allows to capture (when closing in to the center conductor) the electric field (99) in FIG. 9, which is concentrated in the area (36) between the center conductor (32, 98) and the ground planes of the airline (31, 97) (FIGS. 3 and 9). This field capturing allows creating high and controllable reflection factors. The disadvantage of this technique is the requirement of very high precision and resolution vertical movement mechanisms (33, 21, 53), which is controlled by a precision stepping motor (20). Because most of the field capturing effect occurs when the probe is very close to the center conductor, a high resolution vertical movement mechanism is needed. This, on the other hand, slows down the tuning procedure, since, when the probe is away from the center conductor, the tuning effect is much less effective, but the vertical moving speed is the same. In praxis, it takes typically 5 seconds to tune from |GAMMA|=0.05 to |GAMMA|=0.1 (VSWR from 1.1:1 to 1.22:1) and only 1 second to tune from |GAMMA|=0.9 to |GAMMA|=0.95 (VSWR from 19:1 to 39:1). Tuning speed is proportional to the change in VSWR divided by the change in vertical position (Y): SPEED=(Δ.VSWR)/(Δ.Y), whereas the vertical position is directly proportional to the motor stepping speed.

The probes used in slide screw tuners cover only a certain frequency range each. The lower frequency limit (61) is due to limited capacitance, the high end (62) due to resonances and propagation cut-off modes. In general the "longer" the probe, the lower the frequency (FIGS. 5 and 6). Hereby "length" of a probe is its size in direction of the axis of the airline. In order to cover a wide frequency range multiple probes are used (52, 55 in FIG. 5); each probe is attached to a precision vertical axis (53) in a mobile carriage (56) and is controlled by a vertical stepper motor (54). In case of even larger bandwidth three parallel probes are used (see ref. 6, FIG. 4a) which requires three axes, triple carriages and three vertical motors.

This invention discloses multiple frequency band probes using a single carriage, without need for a vertical axis and using a single vertical motor.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 7:
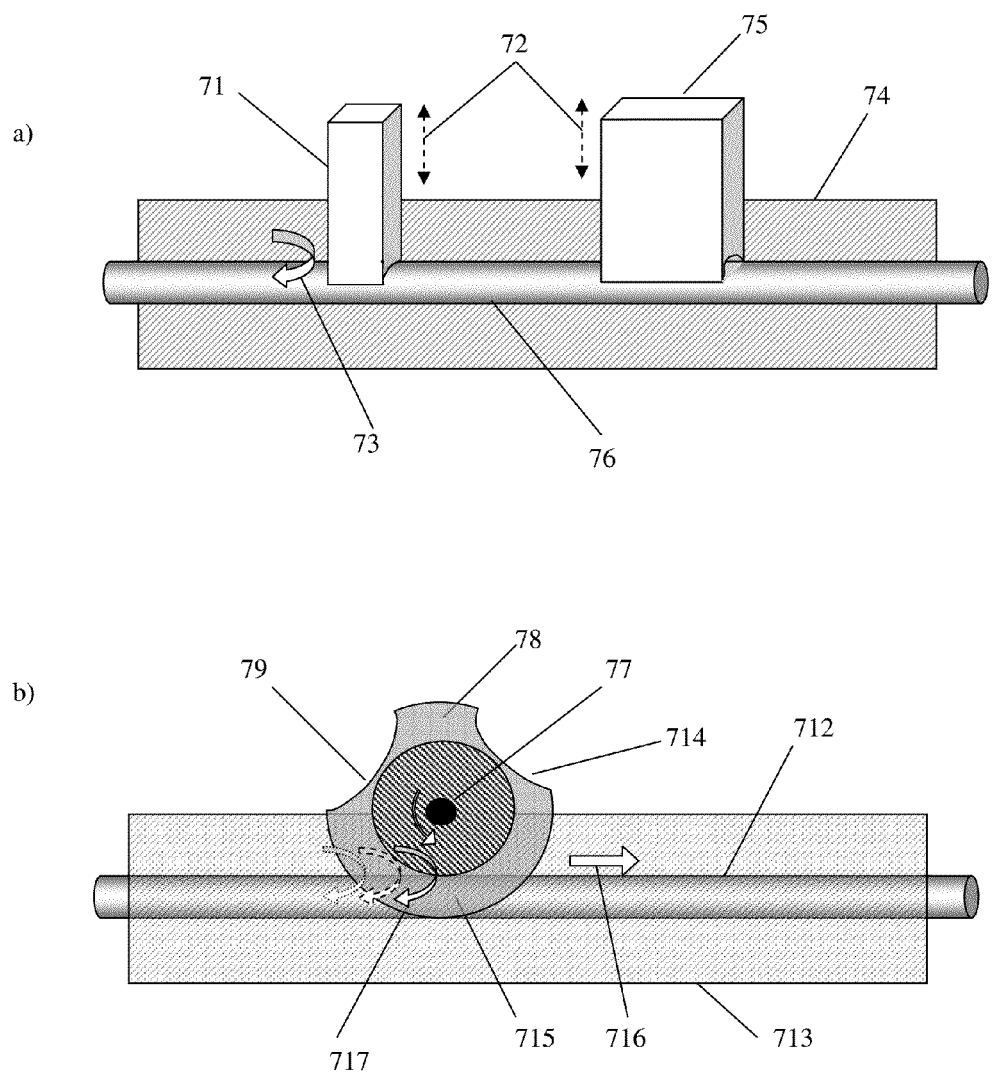
FIG. 7 two probe configurations: a) is prior art, two block shaped probes (slugs) and b) a new disc-shaped probe with two tuning segments of different length.

This invention describes a radio frequency, computer controlled electro-mechanical impedance tuner apparatus, which uses multi-section metallic disc-formed RF reflection probes, instead of block-formed probes used hitherto in such devices. The probes are shown in FIGS. 7(*b*), 8, 9, 12 and 15 to 20 in various configurations and views. Further differences to prior art tuners are the missing vertical axis and associated gear. Beyond that the impedance tuners operate in a similar way and provide equivalent RF performance as prior art tuners; i.e. a horizontal carriage displacement changes the phase and approaching the probe to the center conductor changes the amplitude of the reflection factor (see ref. 2).

Figure 3:
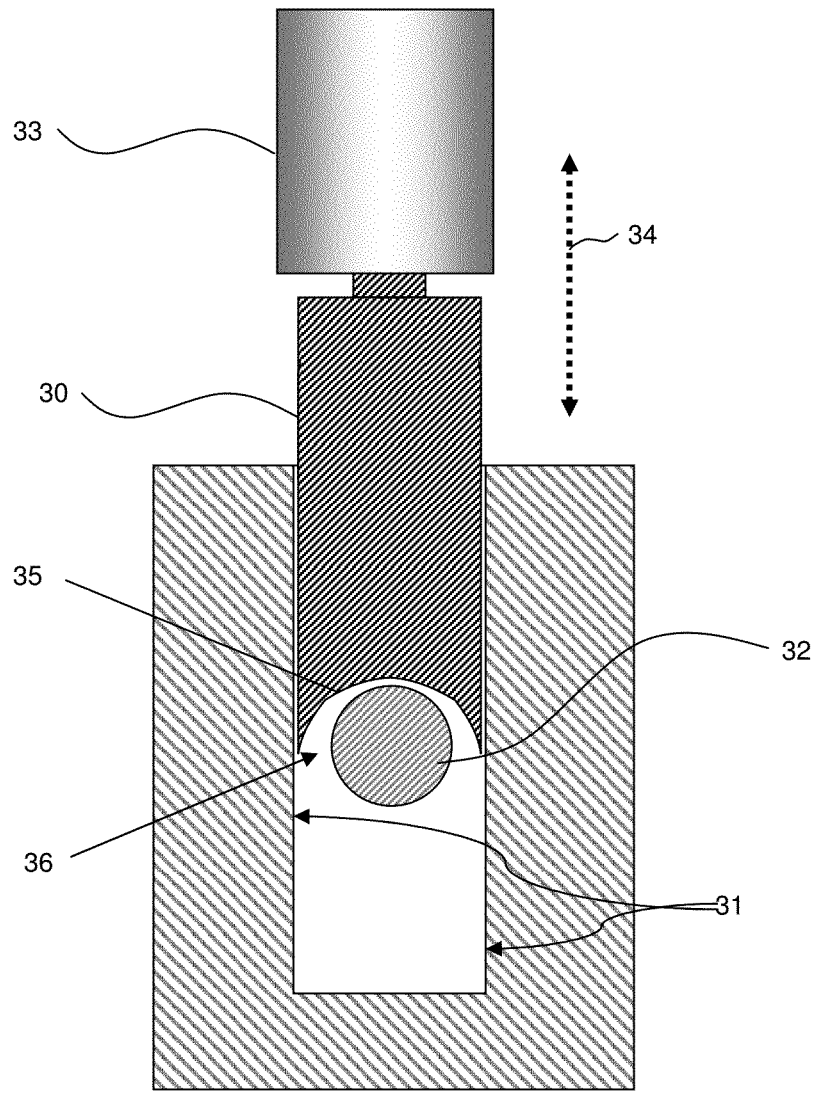
FIG. 3 depicts Prior Art: cross section of RF probe inside a slotted airline (slabline) approaching the center conductor.
Figure 4:
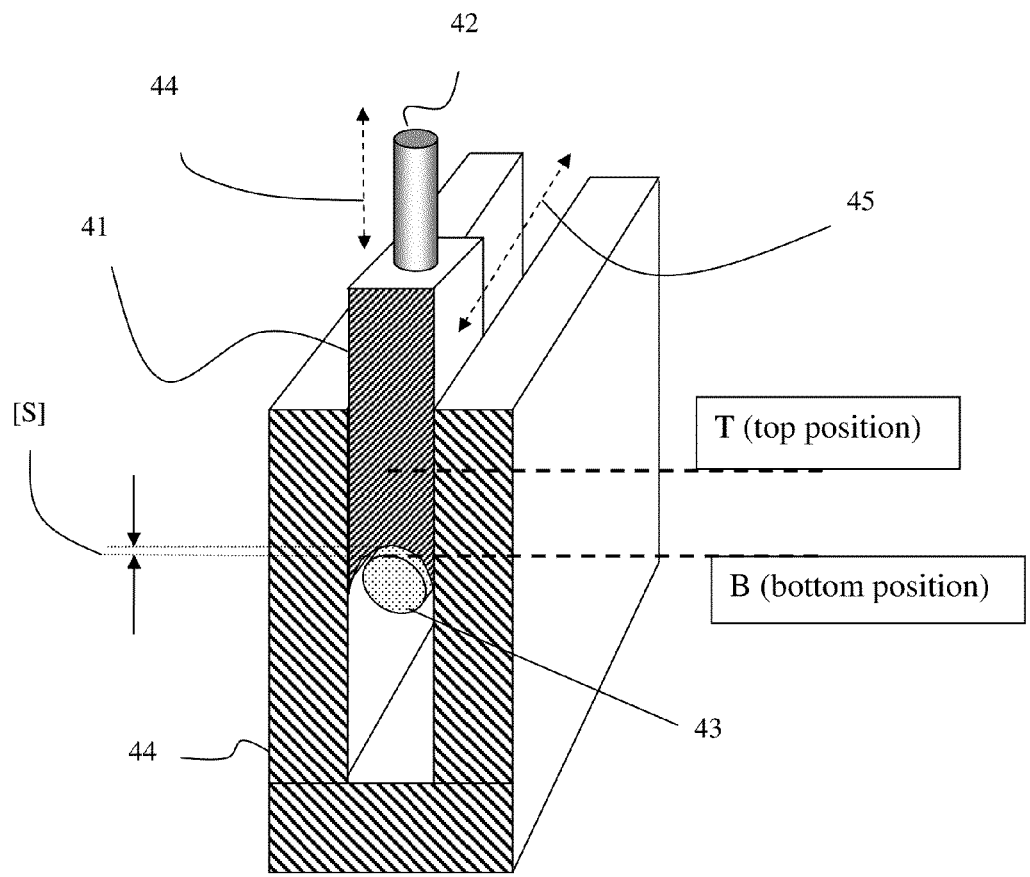
FIG. 4 depicts Prior Art: a perspective view of relevant dimensions and parameters of the operation of a vertically adjustable RF probe (slug).
Figure 6:
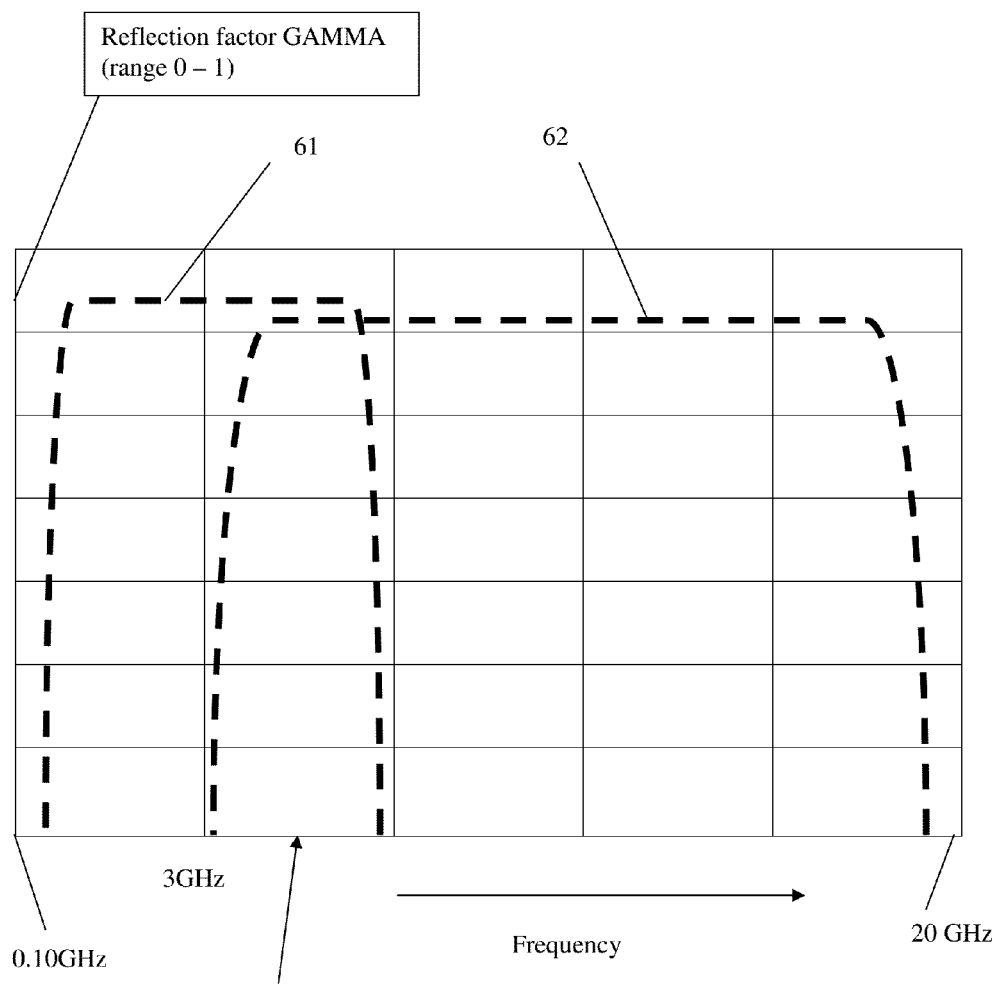
FIG. 6 depicts prior art: frequency coverage of a two-parallel-probe tuner, one low frequency and one high frequency probe.

The fundamental difference between prior art and new probes is shown in FIG. 7: FIG. 7(*a*) shows a prior art RF probe (slug) setup with two slugs (71, 75); each slug has a different horizontal length in order to cover a different frequency band. Slug (71) covers higher frequencies and slug (75) covers lower frequencies: in FIG. 6, slug (71) generates trace (62) and slug (75) trace (61). Each slug can be inserted into the slot of the airline (74) and be positioned (72) in various distances from the center conductor (76); the capacitive coupling between each slug (71, 75) and the center conductor (76), shown also in FIGS. 3, 4 and 9, creates a controllable reflection factor GAMMA. As is shown in FIG. 4, the distance between slug and center conductor must be very small (of the order of 50 micrometers) in order to create sufficient VSWR. This is the case also in the new probes (discs) of FIGS. 7(*b*), 8, 9, 12 and 15 to 20.

Figure 9:
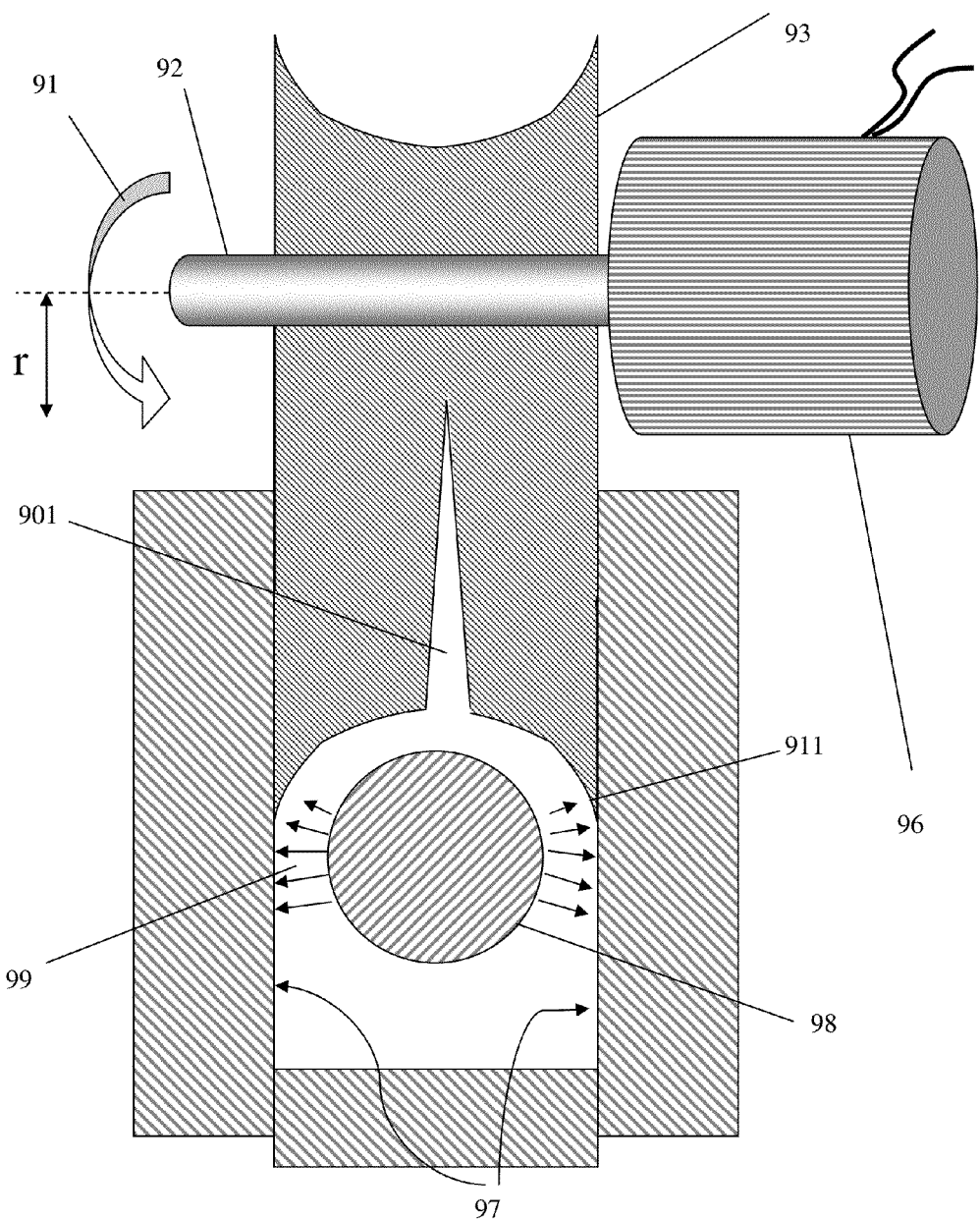
FIG. 9 depicts a cross section of a disc probe and electric field distribution in the airline channel when the area of the probe approaches the center conductor.

The operation of the disc probes is as follows (FIG. 7(*b*): A disc-shaped metallic RF probe (78), best shown in FIG. 19, has a cross section as shown in FIG. 9 (93); the disc is rotating around the axis (92, 77) which is perpendicular to the axis of the airline slot (713) and the center conductor (712) of the airline. One or more moon-shaped segments (79, 714) have been removed from the original disc. This means that, by rotating the disc around the axis (77) one can reach a state where the coupling between center conductor and disc-probe varies between maximum (FIG. 16) and minimum (FIG. 17).

When the disc rotates the protrusion of the probe channel over-hang (911) around the center conductor (98) changes and the capture of the electric field (99) between the center conductor and the side-walls of the airline changes (FIG. 9); therefore also the reflection factor GAMMA changes; by consequence by simply rotating the disc-probe we can control the amplitude of the reflection factor. In order to avoid accidental galvanic contact between the probe and the center conductor, which might destroy the DUT, the concave surface of the groove is coated using a thin layer of insulating material. In order to establish reliable ground contact between the probe and the sidewalls of the slabline a probe design can be used, in which a slot (103, 901) is cut into the body of the disc, parallel to the disc surface, allowing the two halves of the probe to apply a spring contact to the sidewalls (97).

Having two segments of disc remaining (78) and (715) we create the equivalent of a long and a short slug. The segment (78) corresponds to a short (high frequency) slug (71) and the segment (715) to a long (low frequency) slug (75). In short, by just rotating the disc-probe we capture the same effect as having two prior art vertical slugs of FIG. 7*a*).

Figure 15:
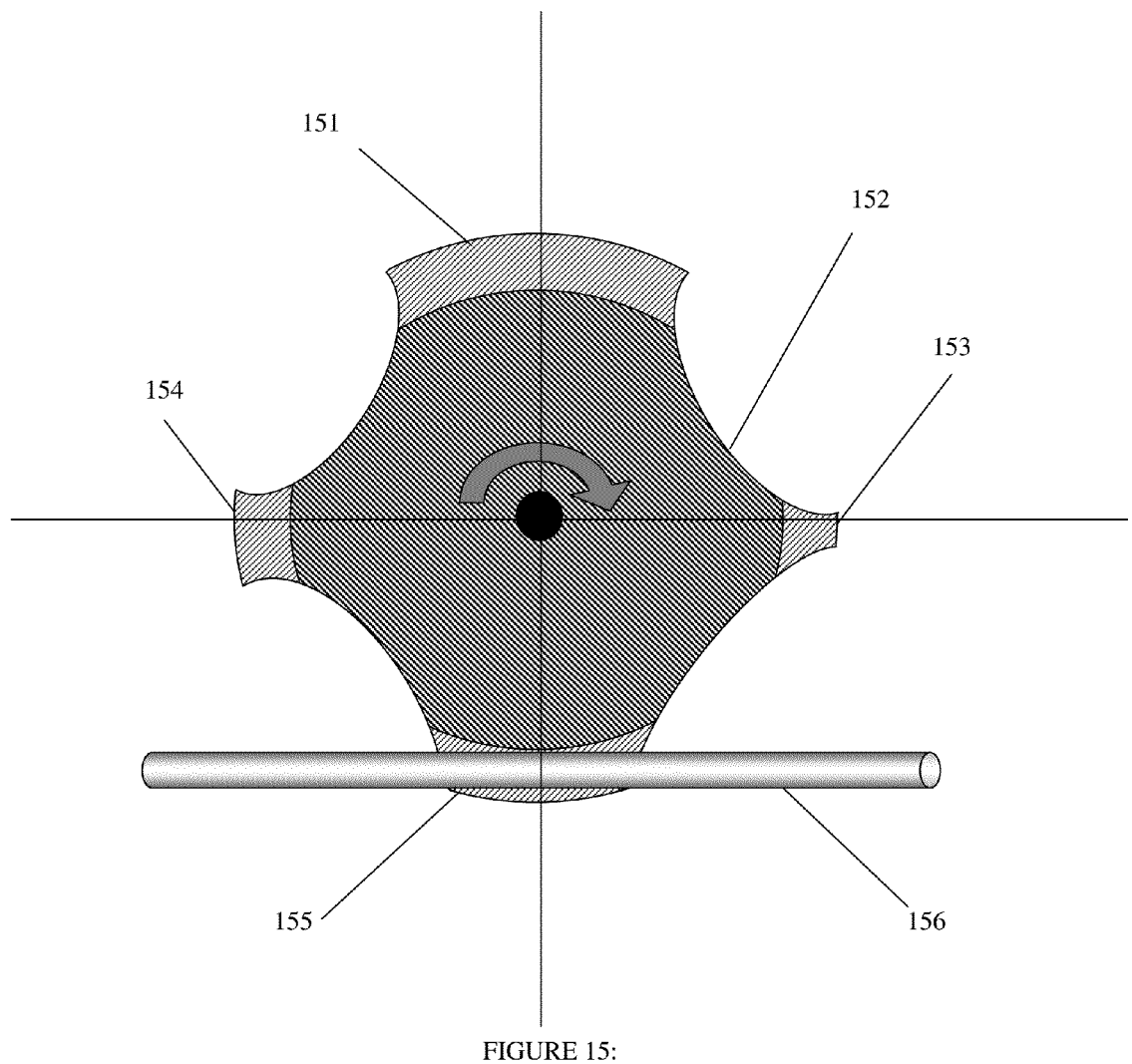
FIG. 15 depicts a four-segment wideband disc-shaped probe; each segment covering a different frequency band.
Figure 16:
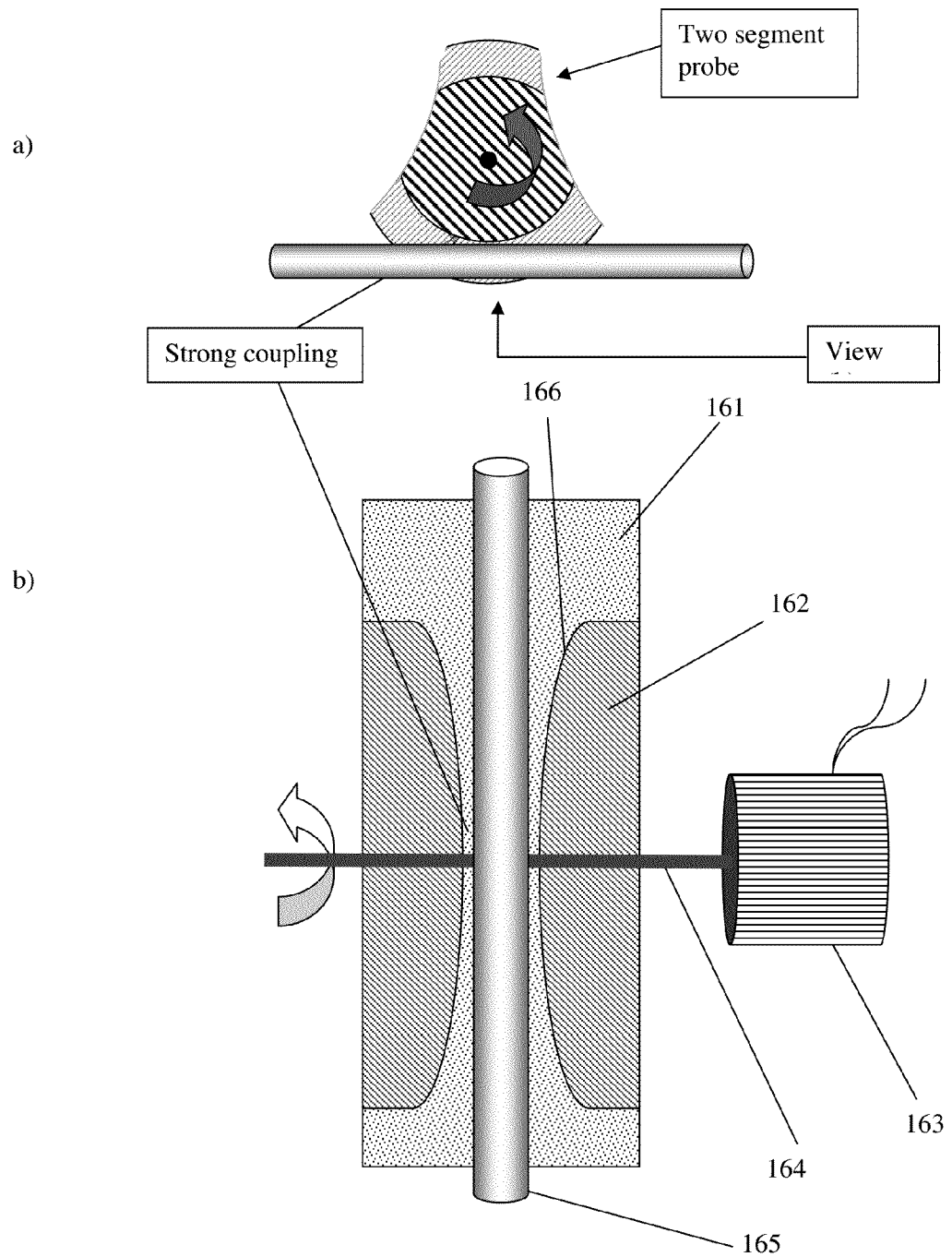
FIG. 16 depicts a front view (a) and cross section (b) of strongly coupled state of the two (similar in multi-) segment disc-shaped probe.
Figure 17:
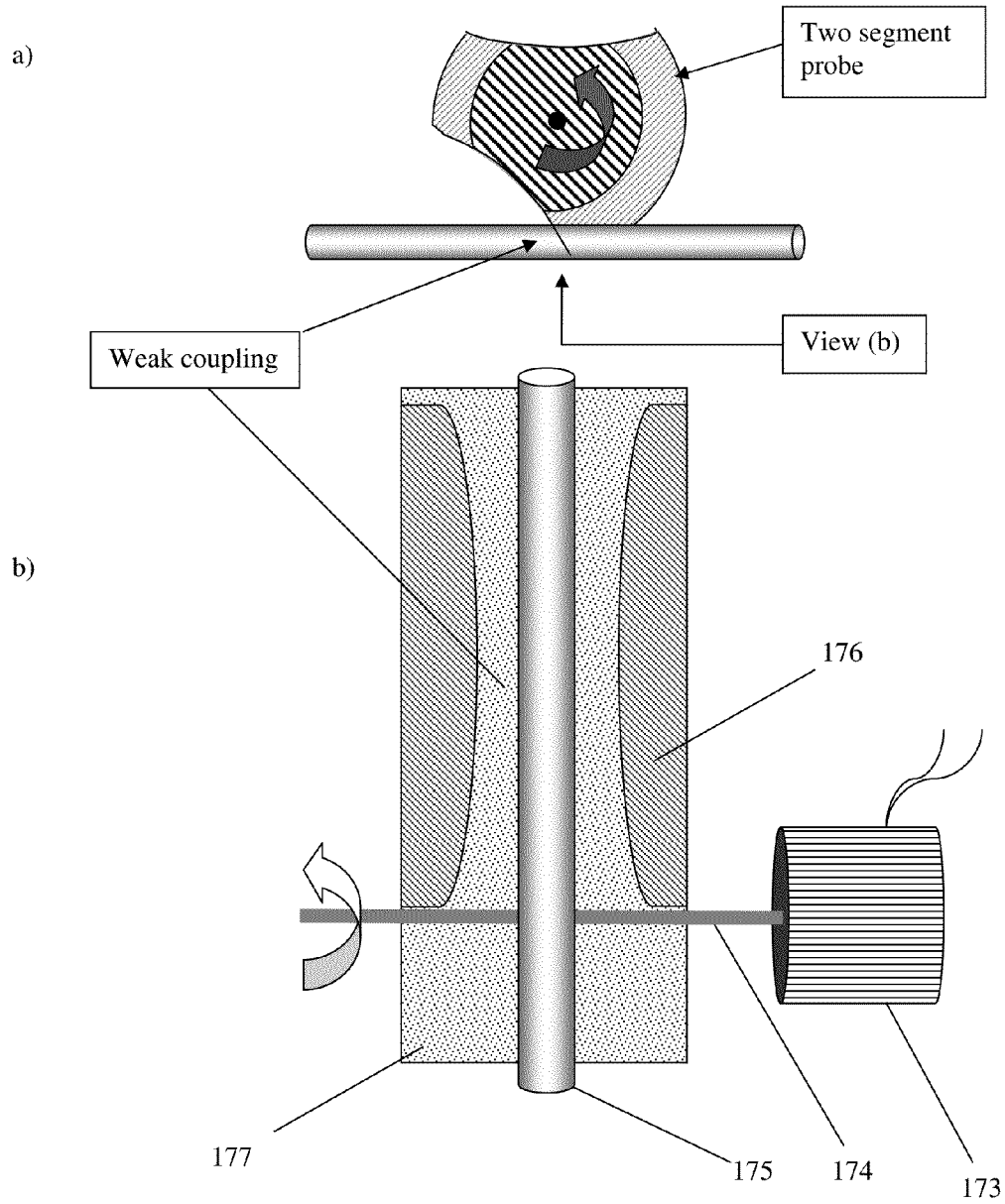
FIG. 17 depicts a front view (a) and cross section (b) of weakly coupled state of the two (similar to multi-) segment disc-shaped probe.

The effect of the rotation angle on coupling between center conductor and multi-segment disc-probe is best shown in FIGS. 16 and 17 for the example of a two-segment probe (the same concept is valid for probes with three or four segments—FIG. 15): the disc is rotated around axis (164) using remotely controlled stepper motor (163); when the disc-channel wings (162) are enveloping tightly the center conductor and the body (161) of the disc is as close as a few micrometers (FIGS. 12 and 16) to the center conductor (165) a maximum portion of the electric field lines is captured, leading to maximum reflection factor.

When in FIG. 17 the disc is rotated by the motor (173) around the axis (174) away from the maximum state (FIG. 17), then coupling of the disc wings (176) with the center conductor (175) is minimum and so is GAMMA.

By controlling Φ (FIG. 8) one can control GAMMA; additional benefit from a disc-probe is the progressive disturbance of the electric field, compared with prior art probes (FIGS. 7(*a*) and 7(*b*); it can be seen the reflection of the injected electromagnetic wave is progressive (717) in a disc-probe, whereas it is abrupt in rectangular probes (73). In general abrupt disturbances create multiple reflections which lead to ripple in the response, of any wave propagation, including microwaves. As the probe (71) moves (72) closer to the center conductor (76) a portion of the travelling wave is reflected (73); in the case of the disc probe (FIG. 7(*b*)), as the sidewalls of the probe-channel (75) envelop the center conductor (712) progressively both in direction of the incoming (714) and the leaving (711) wave, this field disturbance (reflection) occurs progressively. This creates fewer ripples. Similar transformers (tapers) are common in physics in general (Megaphones) and in the microwave art (see ref. 4).

Figure 18:
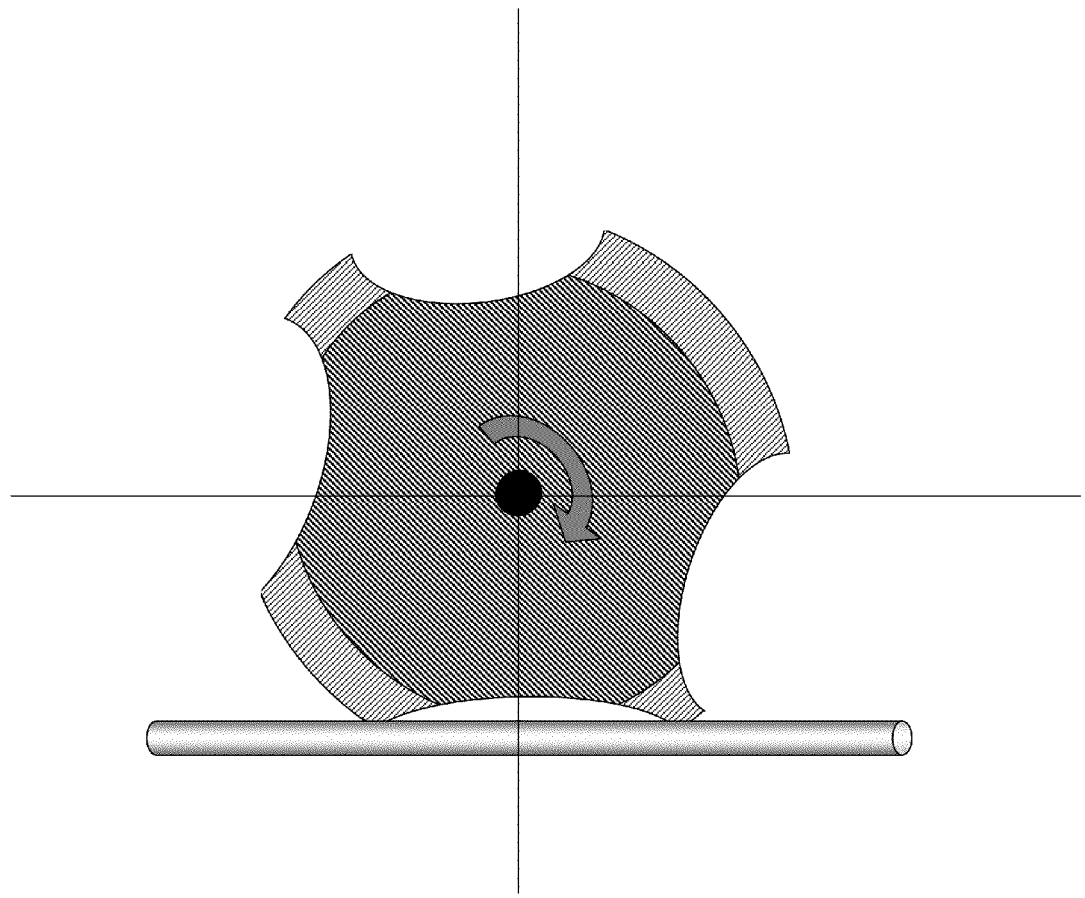
FIG. 18 depicts weak coupling state of four-segment disc-probe of FIG. 15.

A disc-shaped tuner probe can be divided in more than two segments (FIG. 15); depending on the disc and the airline channel width (which is associated with the diameter of the center conductor for determining the characteristic propagation impedance Zo) as well as the frequency range targeted, three or four segments can be carved out of the disc-probe. In FIG. 15 a four segment disc probe is shown with probes covering low frequencies (typically 0.6 to 2 GHz (151)), medium frequencies (1-6 GHz (155)), high frequencies (3-12 GHz (154)) and very high frequencies (8-18 GHz (153)); or for a narrower airline and center conductor of smaller diameter the corresponding maximum frequency can be 50 GHz (segment (153) covering 18-50 GHz), then segment (154) covering 9-26 GHz, segment (155) covering 4-12 GHz and segment (151) covering 2-6 GHz. This way a multi-octave tuner can be made using a single multi-segment probe structure; by rotating this probe, as shown in FIG. 18, the coupling can be reduced for the actual medium frequency segment (155) and by continuing the rotation the very high frequency segment (153) will engage.

Further-on the over-hanging walls (127, 128, respectively 134, 137) of the disc channel can be made short or long, depending on the application and the overall disc diameter (FIGS. 12 and 13); by making said over-hanging longer we achieve higher coupling, but reduce the available segment area (152) that can be carved out of the disc to allow for distinct segments covering multiple frequency ranges (FIG. 15).

Figure 10:
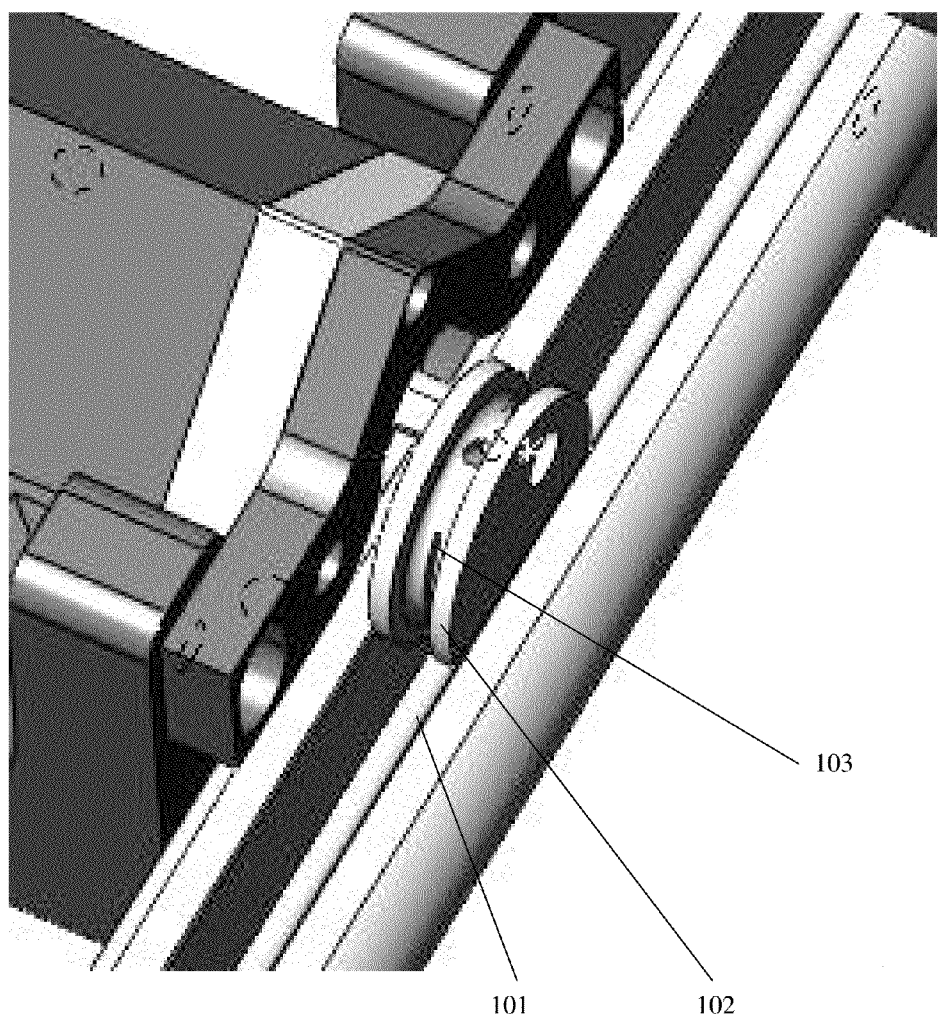
FIG. 10 depicts perspective view of rotating RF probe in a airline.
Figure 11:
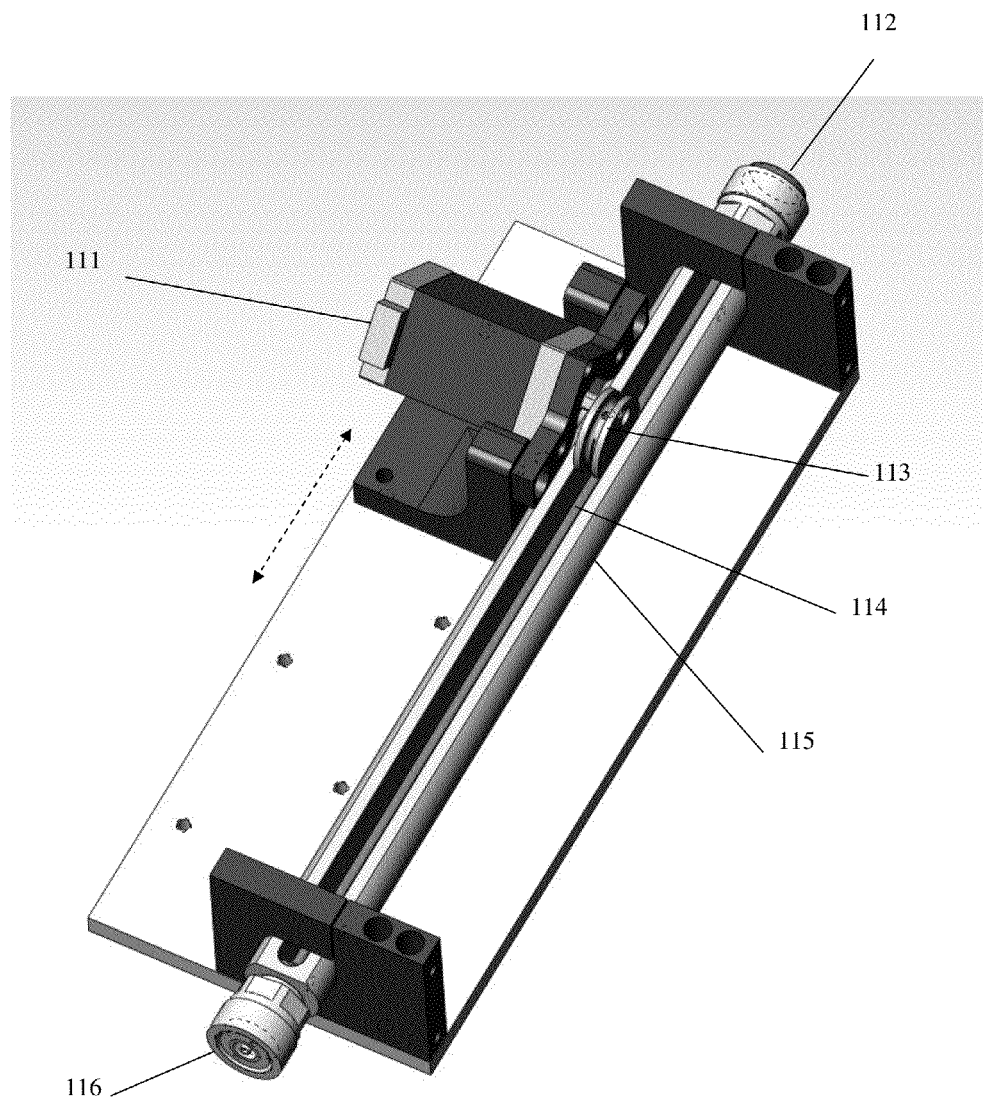
FIG. 11 depicts perspective view of rotating RF probe in a tuner assembly.

FIG. 10 offers a perspective view of the tuning area of the tuner, the disc-probe (102) and the center conductor (101); FIG. 11 shows the overall tuner (without a 'prior art' horizontal carriage control), the input and output ports (112, 116), the airline (115), the center conductor (114), the disc-probe (113) and the stepper motor (111).

Figure 5:
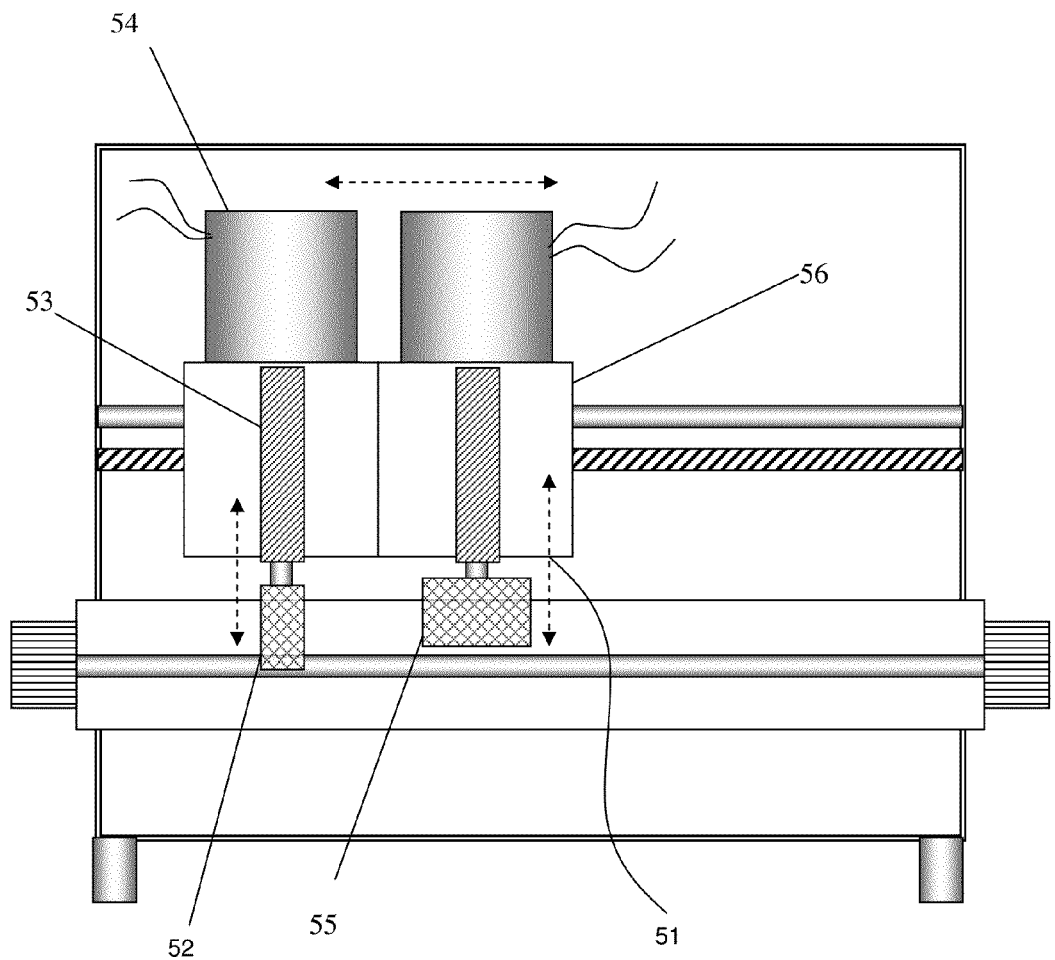
FIG. 5 depicts prior art: front view of a wideband tuner with double carriage and two probes covering two different frequency bands.

A further advantage of the here disclosed disc-probes (shown in FIG. 19), compared with prior art block-probes (shown in FIG. 7*a*), is the avoidance of edge effects and associated peak electric fields and corona arcing. The difference can be seen between FIGS. 5 and 7(*a*) on one hand and 7(*b*), 16, 17 and more clearly in FIG. 19 (195) on the other: At the position (52) at the edge (corner) of the block-probe the voltage between center conductor and ground will cause an electric field, which is higher than the average field due to the RF power injected, and thus possible premature arcing (corona discharge); this is shown in FIG. 7(*a*) by arrow (73); in the case of a disc-probe (FIGS. 7(*b*), 16, 17 and 19) there are no edges creating peak electric fields: the transition from the center conductor to grounded probe is gradual: (166) in FIG. 16, (714) in FIG. 7 and (195) in FIG. 19. This lowers the electric field and thus the risk for arcing.

Figure 1:
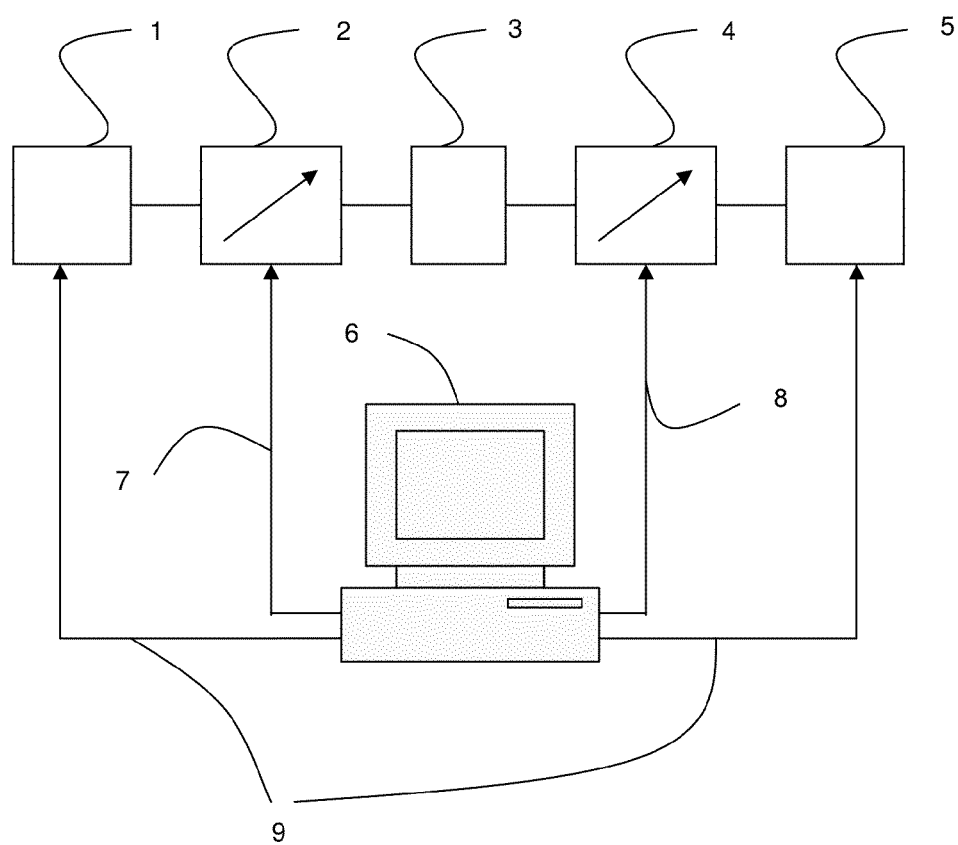
FIG. 1 depicts Prior Art: a typical automated transistor load pull test system.
Figure 2:
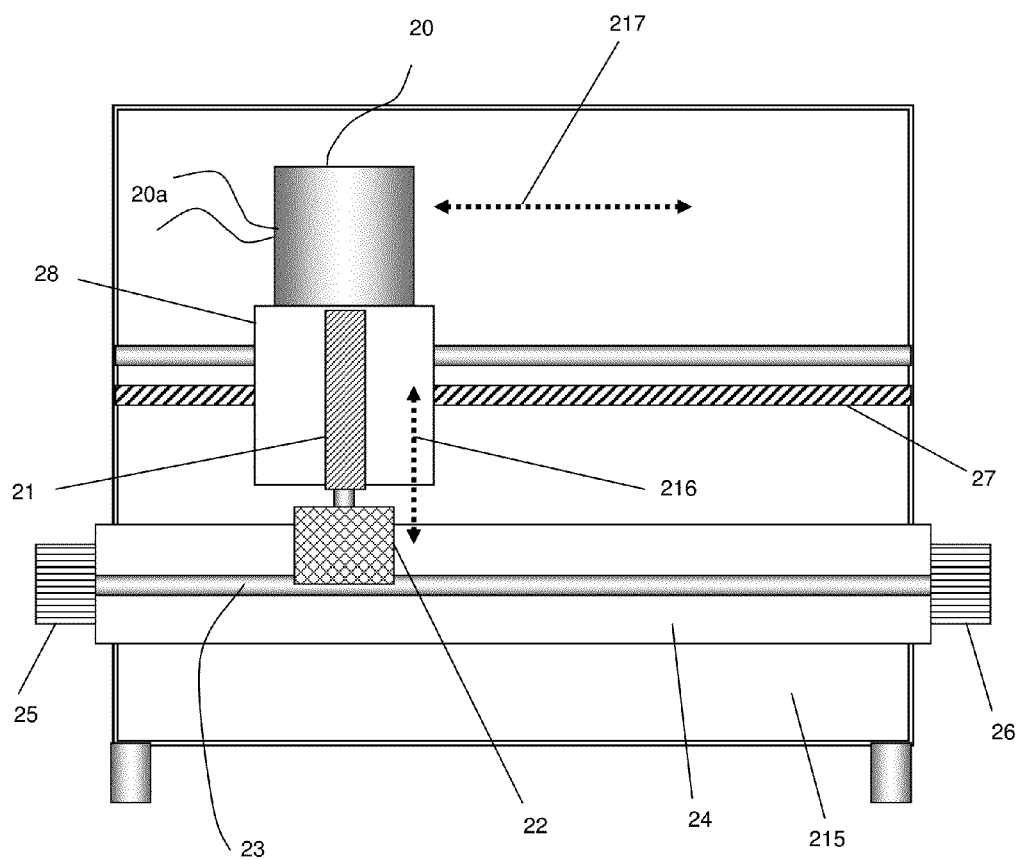
FIG. 2 depicts Prior Art: a front view of an automated slide screw impedance tuner using a single vertical axis and RF probe (slug).
Figure 8:
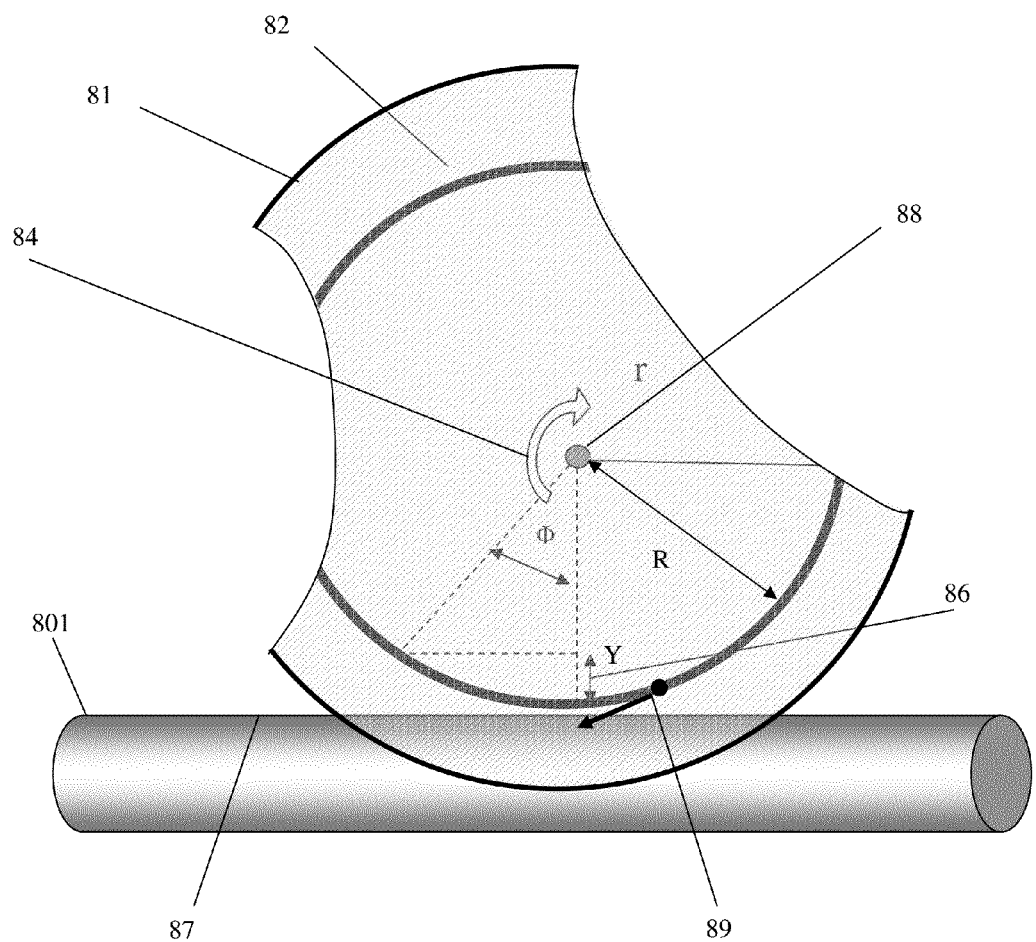
FIG. 8 depicts schematics of coordinates of a rotating two-segment disc-shaped probe.

The rotation of the bottom point of the disc-probe as it approaches the center conductor causes it to travel horizontally (89) in FIG. 8. The disc-probe does not approach the center conductor at one point (FIG. 8); the increase of the capacitance, as a prior art block shaped probe (slug) approaches the center conductor creates a negative phase turn of GAMMA on the Smith chart (see FIG. 1 in ref. 5); in the case of a disc-probe as disclosed here, the horizontal shift of the closest point, as the probe rotates (84), when viewed from the test port (801) of the tuner (from the left in FIG. 8) will create a compensation (linearization) of the original phase shift as a function of increasing reflection factor, which also improves the interpolation accuracy of the algorithms used to calculate GAMMA between calibrated points (see ref. 5).

Figure 19:
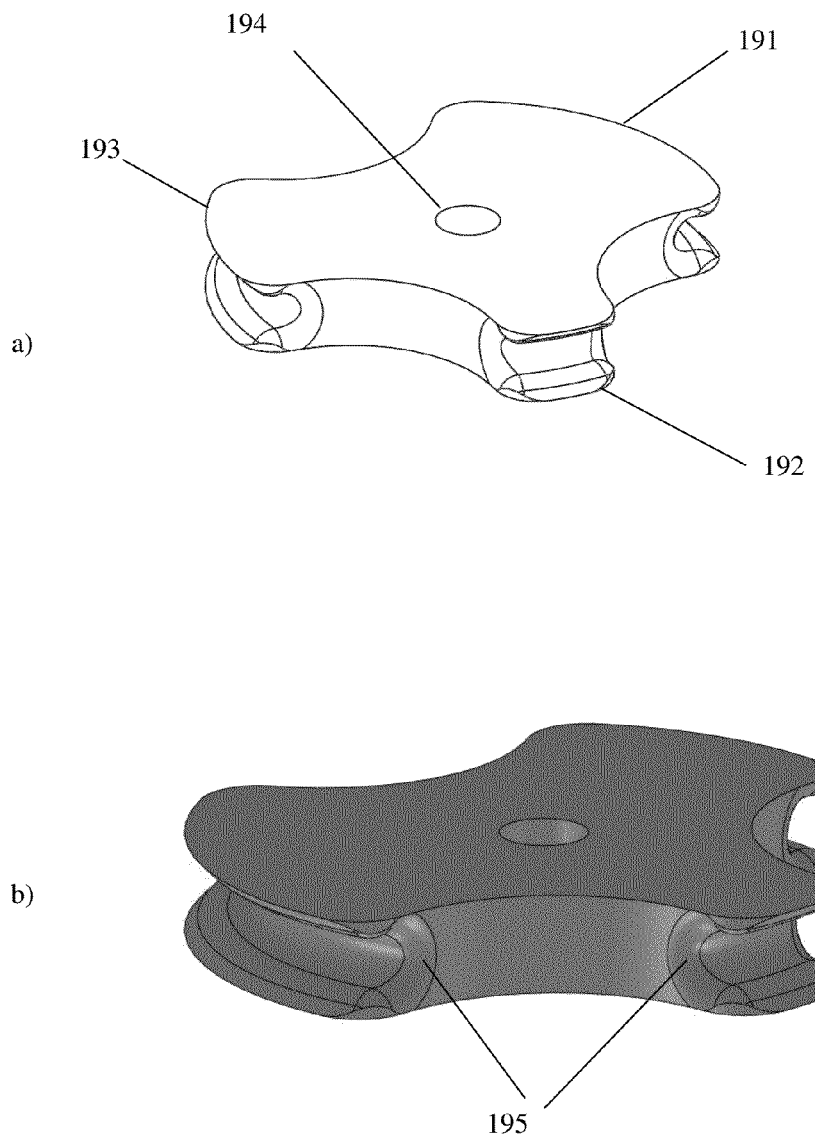
FIG. 19 (*a*, *b*) depicts 3D views of a three-segment disc probe.
Figure 20:
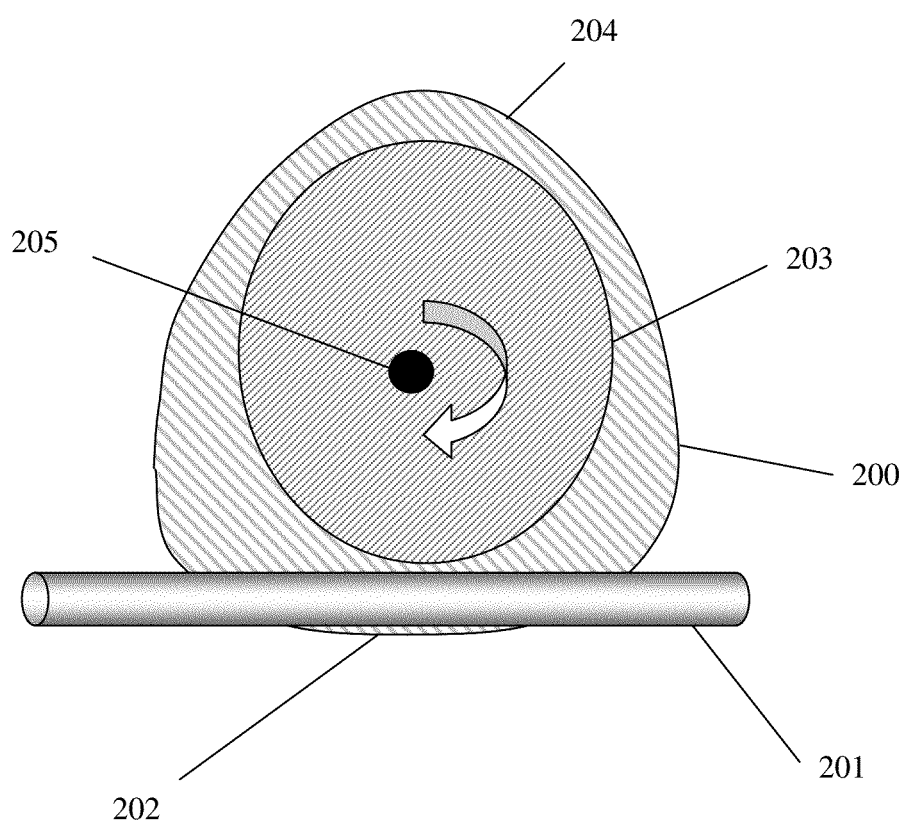
FIG. 20 depicts a front view of oval shaped disc-shaped probe.

Finally a three-dimensional view of a three-segment disc-probe is shown in FIG. 19. Segment (191) covers low frequency band, segment (193) covers medium frequencies and segment (192) high frequencies. The rotation axis (194) is approximately in the geometrical center of the disc.

Figure 12:
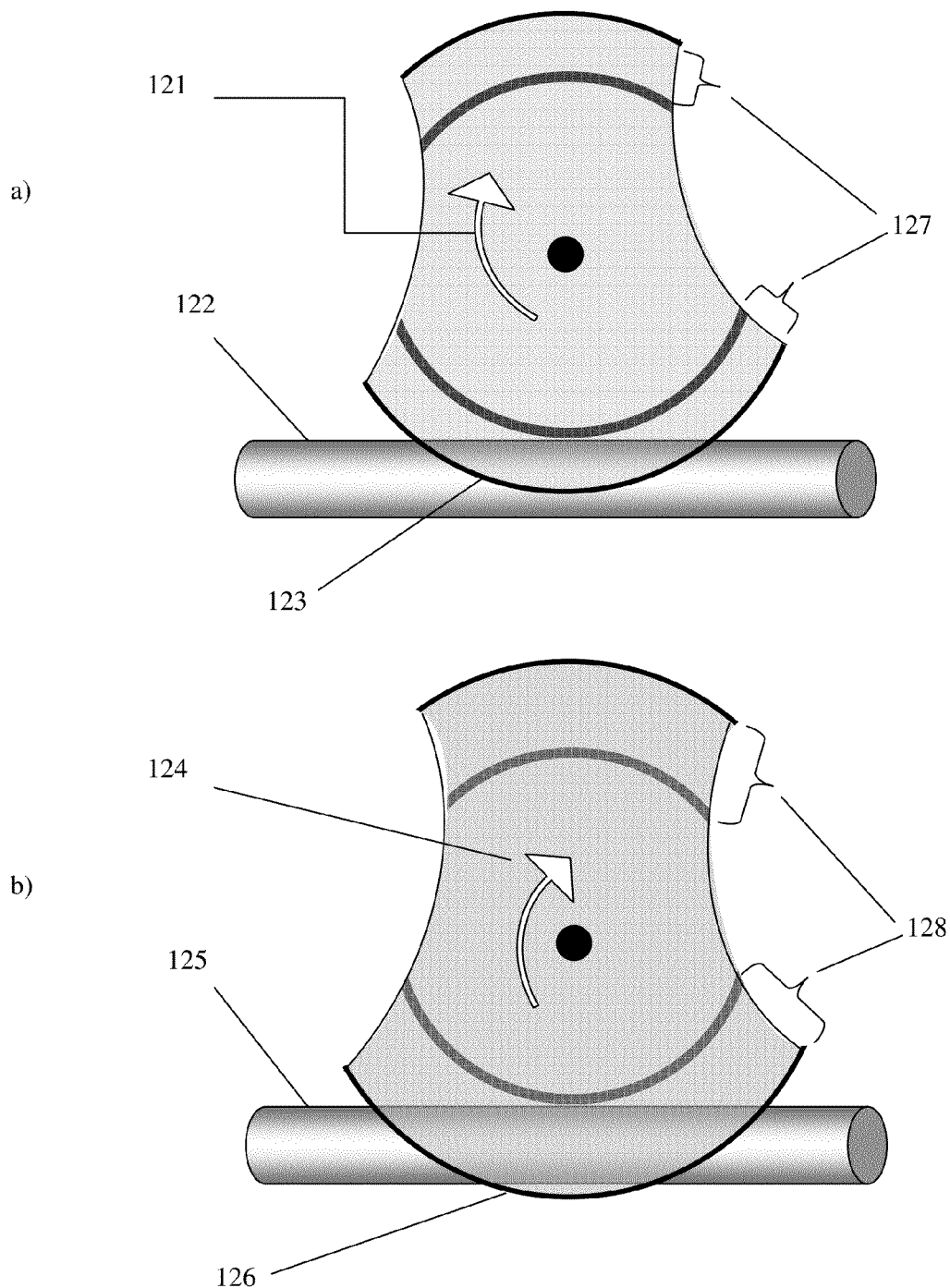
FIG. 12 depicts two versions of rotating two-section RF probe: a) probe with short and b) with long channel wall over-hang.
Figure 13:
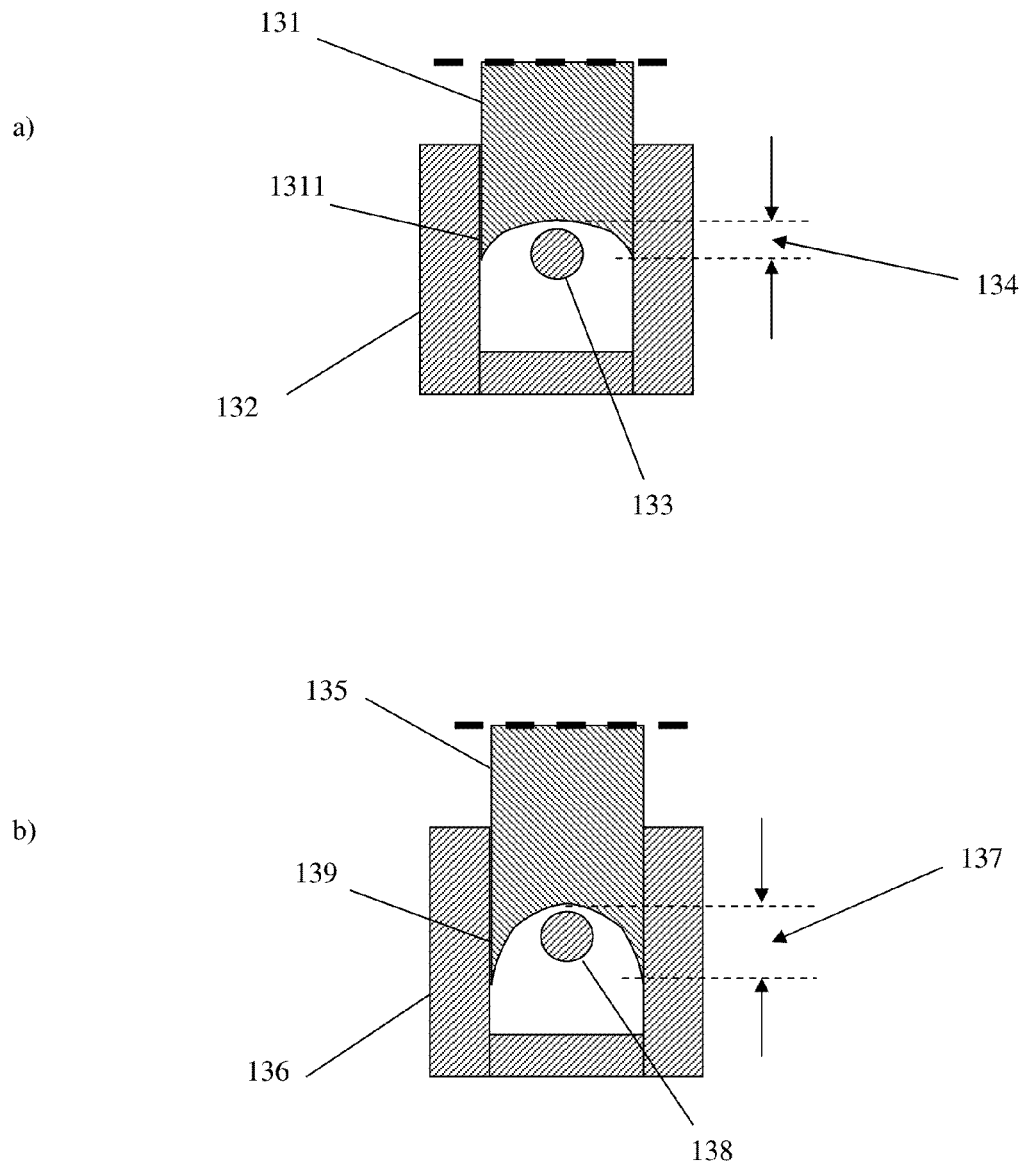
FIG. 13 depicts two versions of rotating RF probe: a) with short protruding over-hang (FIG. 12*a*); b) with long protruding over-hang (FIG. 12*b*).

An alternative disc-probe design is shown in FIG. 12: in the case of FIG. 12(*b*) the protruding over-hang wings (126) of the probe are longer than the overhang wings (123) of the probe in FIG. 12(*a*). The coupling is here also controlled by rotating the probe, but in the case of FIG. 12(*b*) more electric field is captured (see also shorter overhang, item (134) versus longer overhang, item (137), both in FIGS. 13(*a*) and 13(*b*)). So the two segments of the probe (124) can be used to operate a tuner with certain GAMMA limitation: Long overhang means higher GAMMA.

Figure 14:
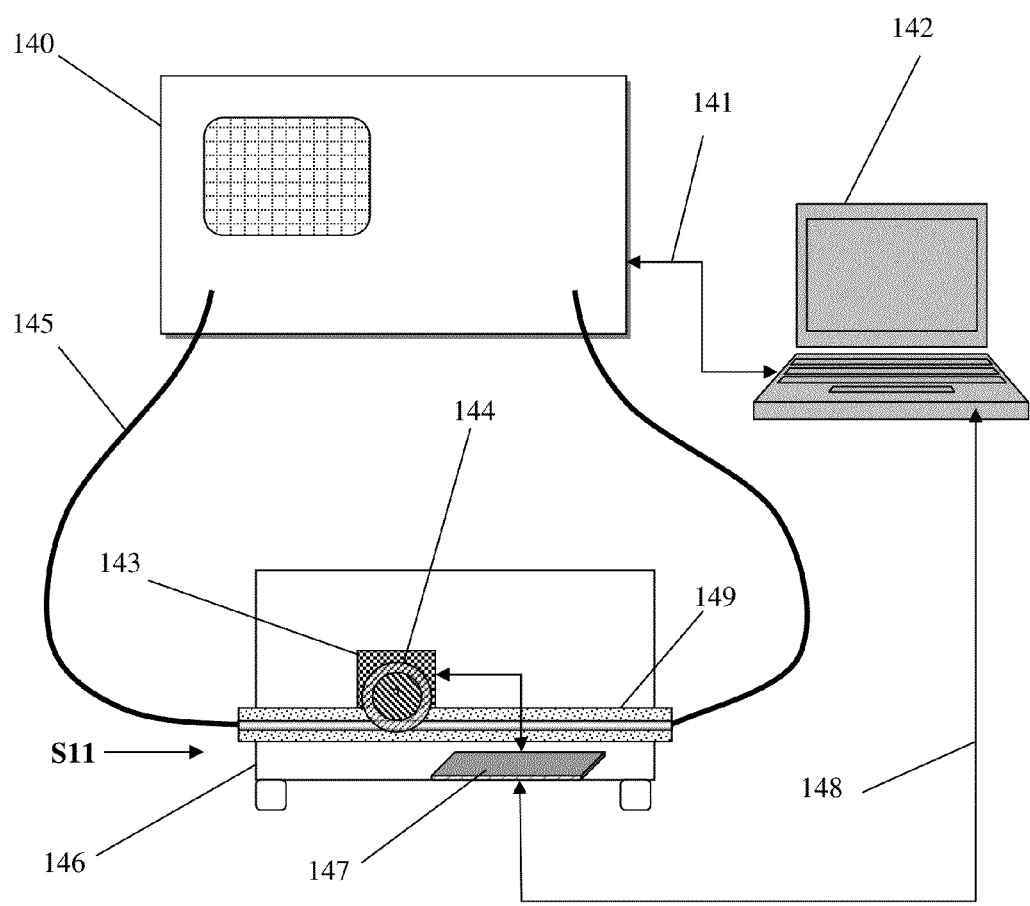
FIG. 14 depicts calibration setup of automated tuner using a VNA.

The tuner calibration process uses a setup as in FIG. 14: the stepper motor (143) is directed by the control computer (142) to rotate the disc probes into the slot of the airline in order to increase the GAMMA value, while reading the four scattering parameters (s-parameters) from the Vector Network Analyzer-VNA (140) using standard communication cable (141) and protocol. S-parameters of the tuner are measured at typically 10 to 20 angles of the disc-probe, corresponding to minimum and maximum GAMMA, and saved in a calibration file in the form $S_{ij}(\Phi_i, X_i)$; where $\Phi_i$ is the angle relative to the vertical direction (FIG. 7) and horizontal position $X_i$ of each probe-carrying carriage between a starting (zero) position and one half of a wavelength at the selected frequency. This procedure is repeated for each disc-probe segment (715) or (78) in FIG. 7 and all corresponding segments in the other Figures, at each frequency of interest covered by the corresponding segment and the data are saved in successive calibration files for later use.

When an impedance synthesis (tuning) is requested by a user, the computer loads the calibration data from the harddisk into its active memory and scans through them to find the closest match for the parameter S11 in the s-parameter matrix. After the first step a second search is performed, in which interpolated data between calibration points are used and a final match is found, usually very close or identical within approximately a vector difference of close to 1% or less of the requested impedance value.

Impedance synthesis using s-parameters of tuners is a specific procedure related to specific tuners which shall not be elaborated further here (see ref. 5). This does not, however, limit the scope of the invention itself, since the invention relates to the new disc-probes used in the tuner apparatus rather than the tuning technique and presumes appropriate control software allowing calibration and tuning to be available. The calibration procedure has been laid out briefly only in order to manifest the fact that this wideband tuner is being used for impedance synthesis, when previously calibrated and the calibration data are used accordingly.

Obvious alternatives to the disclosed multi-segment disc-shaped RF probes for slide screw tuners are possible but shall not impede on to the validity of the present invention.

What I claim as my invention is:

1. Oval shaped metallic disc-probes for slide screw impedance tuners, said tuners having an input port and an output port and a slotted airline between said ports, and a mobile carriage running parallel to the airline and carrying said disc-probes, said probes having a thickness matching the width of the slot of said airline;

and a concave groove on the disc periphery, parallel to the disc surface, said groove diameter matching the diameter of the center conductor of said airline;

and a rotation axis perpendicular to the axis of said airline and placed approximately at the center of said disc;

whereby said disc-probes are rotated into the slot of said airline using remotely controlled stepper motors;

said motors being attached to said carriages.

2. A slide screw impedance tuner comprising a test port and an idle port and a slotted airline between said ports, and one or more mobile carriages sliding parallel to the axis of said airline;

and multi-segment disc-shaped rotating metallic probes (disc-probes);

said probes being mounted on said mobile carriages, wherein the surface of the disc-probes is parallel to the airline slot;

said probes being insertable by rotating vertically into the slot of said airline;

and wherein the rotation axis of said disc-probes is approximately the same as their geometric center;

said rotation axis of said probes being attached to remotely controlled electrical stepper motors using appropriate gear.

3. Multi-segment metallic disc-probes for tuners as in claim 2, having a thickness matching the width of the slot of said airline;

and a concave groove on the disc periphery, parallel to the disc surface, said groove diameter matching the diameter of the center conductor of said airline;

and a rotation axis perpendicular to the axis of said airline and placed approximately at the center of said disc;

and having two oval segments carved out of the periphery of said discs said carved segments creating two distinct tuning sections of different arc length.

4. A disc-probe as in claim 3, whereby three oval segments are carved out of the periphery of said discs, said carved segments creating three distinct tuning sections of different arc length.

5. A disc-probe as in claim 3, whereby four oval segments are carved out of the periphery of said discs, said carved segments creating four distinct tuning sections of different arc length.

6. Disc-probes as in claim 3, whereby the concave surface of said groove is dielectrically coated.

7. Disc-probes as in claim 3, having a narrow slot centered along the said groove.

8. Disc-probes as in claim 3, having long over-hanging sidewalls of the concave groove reaching beyond the diameter of said center conductor applied on at least one tuning segment.

9. A calibration method for electro-mechanical impedance tuner as in claim 2, connected to a pre-calibrated vector network analyzer (VNA), comprising the following steps:

a) a segment selection step, wherein the tuning segment of the disc-shaped multi-segment probe corresponding to the calibration frequency is chosen and the associated rotation angle of the disc-probe is saved;

b) an initialization step, whereby said tuner is initialized, i.e. said carriage is moved to an initial horizontal position and the disc-probe is rotated at the minimum coupling angle of said segment defined in step (a);

c) a scaling step, whereby said disc-probe is rotated into the slot of said airline, wherein said tuning segment selected in step (a) approaches the center conductor, and measure the reflection factor GAMMA and save in memory said GAMMA and the rotation angles associated to a number of GAMMA values between GAMMA.min and GAMMA.max, said number of GAMMA values being, typically, between 10 and 20;

d) a measurement step, whereby tuner s-parameters are measured and retrieved from the VNA for said saved rotation angles determined in step (c) and a multitude of horizontal carriage positions between the initial position and a horizontal distance of at least one half of a wavelength at the selected frequency, and save in tuner calibration file.

10. An impedance synthesis algorithm for tuners as in claim 2 comprising the following steps:

a) user definition of the target impedance (GAMMA.target), b) search algorithm, in computer memory, in calibration data for the calibrated test port reflection factor value (S11.c) closest to GAMMA.target (defined for the vector difference |S11.c-GAMMA.target| to be minimum);

c) alternative horizontal position and rotation angle search algorithm of interpolated points, in computer memory, in the vicinity of the calibrated point S11.c for reflection factors (S11) best matching GAMMA.target, defined for the vector difference |S11-GAMMA.target| to be minimum;

d) move the carriage and rotate the probe to the horizontal position and angle found in step (c).

11. A method for generating adjustable reflection factor in slotted microwave airlines; said airlines having an input and an output port, and conductive parallel plate sidewalls forming a slot, and a center conductor between said ports running along the said slot;

said method comprises two steps:

a) insert into the slot a conductive multi-segment disc having a concave groove on its periphery and making RF contact with the sidewalls, whereby the surface of said rotating disc is parallel to the said sidewalls;

b) approach the concave periphery of a segment of said disc to the center conductor.

12. A method as in claim 11, whereby said disc is rotated around its geometrical center to allow control of the distance between the center conductor of said airline and the channel of the said segment of said disc.

* * * * *